July 11, 1950 M. I. BURGETT 2,514,357
PERMEABILITY-TUNED HIGH-FREQUENCY AMPLIFIER
Filed June 22, 1946
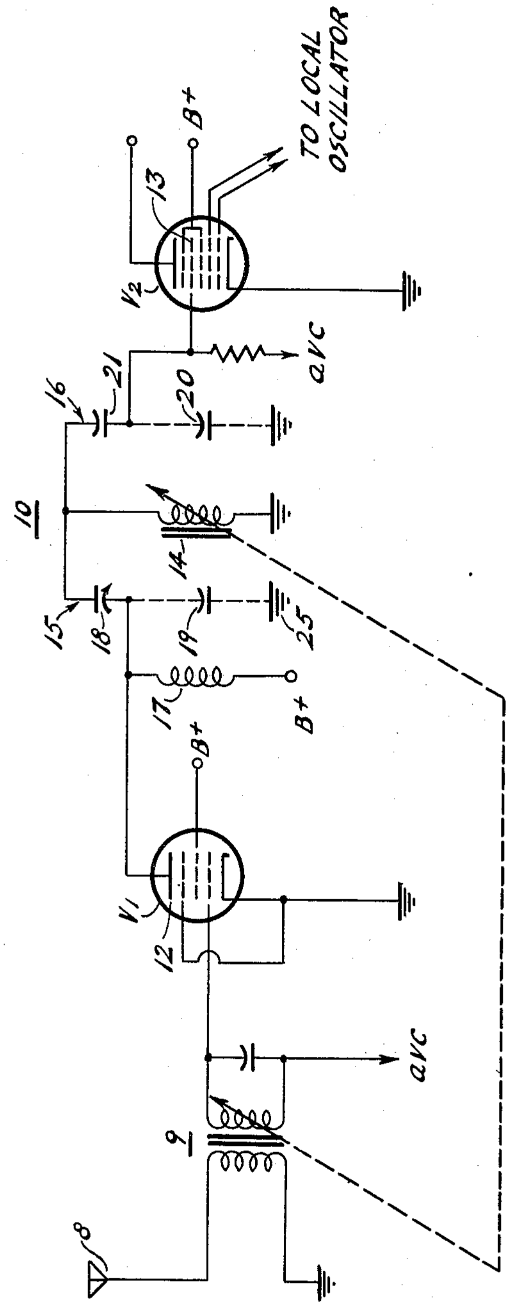
INVENTOR.
MONTE I. BURGETT
BY
Brown, Denk & Synnestvedt
AGENTS Patented July 11, 1950

2,514,357

UNITED STATES PATENT OFFICE 2,514,357

PERMEABILITY-TUNED HIGH-FREQUENCY AMPLIFIER

Monte I. Burgett, Philadelphia, Pa., assignor to Philco Corporation, Philadelphia, Pa., a corporation of Pennsylvania Application June 22, 1946, Serial No. 678,576

1 Claim. (Cl. 179—171)

This invention relates to improvements in radio frequency amplifier circuits. More particularly, the invention relates to improvements in high carrier-frequency amplifier stages adapted to be tuned by variation of the inductance element of a tunable resonant network. Inductance-tuned circuits are profitably employed as preselector circuits in superheterodyne radio receivers intended for installation in automobiles or the like; they are also employed in other installations where space is limited and high gain is of particular importance.

Radio receivers installed in motor vehicles are of course subjected to considerable vibration and it has been common practice, in automobile-type receivers adapted for reception in the standard broadcast band, to employ inductance tuning in order to avoid the undesirable audio modulation which, if capacitance tuning be used, tends to be introduced into the receiver circuit through the vibration of the variable capacitor plates. Inductance tuning is ordinarily accomplished by moving a comminuted magnetic core within the field of the coil constituting the inductive element in the resonant circuit. This method of inductance tuning is frequently referred to as permeability tuning.

While, as indicated above, permeability-tuned receivers have found important application in the broadcast band (550 to 1500 kc.), there is an important factor which heretofore has made it difficult to obtain satisfactory gain in the R.-F. amplifier stages of permeability-tuned radio receivers where very high carrier frequencies are involved, as for example, in receivers intended to operate in the frequency-modulation band which extends from 88 to 108 megacycles. The difficulty referred to arises from the fact that at very high frequencies the distributed capacitances to ground inherently associated with the tuned circuits are large enough to prevent employment of adequate inductance across which the high frequency voltages may be developed. In considering a given tuned radio frequency amplifier, it is to be remembered that the gain of such device is very nearly proportional to the ratio L/C (where L and C are the values of the inductance and capacitance respectively of the amplifier's parallel resonant circuit). Accordingly, in designing radio frequency amplifiers it is customary to so proportion the resonant elements as to ensure a relatively high L/C ratio. It will, of course, be understood by those skilled in the art that the resonant frequency of a parallel-resonant circuit is determined by the reciprocal of the square root of the product of its capacitance and its inductance, and that, for a given frequency, any increase in capacitance must be balanced by a corresponding decrease in inductance. Therefore it is frequently important that the stray shunt capacitances associated with a given tuned circuit be minimized, and this is particularly true at very high frequencies where the total undesired stray capacitance is substantially greater than the desired or optimum tuning capacitance.

In accordance with the present invention, there is provided a novel tuned interstage coupling network whose parts are so arranged as greatly to minimize the effective shunt capacitances formed across the tuned network by the various stray tube circuit capacities. This reduction in shunt capacitance permits the use of a correspondingly increased inductive component, and results in a greatly increased L/C ratio, and hence increased gain. I accomplish this reduction in shunt capacitance by the insertion of certain additional capacitances in series with the undesired shunt capacitances in such manner as to reduce the overall shunt capacitance.

It is an object of this invention to provide means in a permeability-tuned radio frequency amplifier circuit for obtaining improved voltage gain at high carrier frequencies.

It is another object of this invention to provide a novel permeability-tuned radio frequency amulifier circuit which employs a greater inductance in the resonant interstage coupling network than would be permissible conventionally, thus making possible the development of increased voltage across the network and thus providing increased gain.

It is a further object of this invention to provide means in a permeability-tuned high carrier-frequency amplifier stage for reducing the detrimental effect of inherent distributed capacitances on the voltage gain of the stage.

These and other objects and advantages of the present invention will be best understood from a consideration of the following description and accompanying drawing wherein the single figure illustrates a preferred embodiment thereof.

Referring now in more detail to the drawing, there is shown an antenna 8 coupled to vacuum tube $V_1$ by means of permeability-tuned antenna transformer 9 mechanically ganged, as indicated by the dotted line, with the permeability-tuned inter-stage resonant network 10 or an R.-F. amplifier circuit. The amplifier circuit is entirely conventional except for resonant network 10 which is hereinafter fully described; the network 10 couples plate electrode 12 of tube $V_1$ to control grid 13 of tube $V_2$. In many conventional R.-F. amplifier circuits, tube $V_1$ is a pentode and tube $V_2$ is a pentagrid frequency converter; and tubes of these types are shown in the drawing. Other tubes may, of course, be employed in lieu of those illustrated.

Resonant network 10 comprises a tunable inductive branch 14 shunted by a pair of capacitive branches 15 and 16. The function of R.-F. choke coil 17 is merely to provide a path for D.-C. battery current and the choke coil is not part of the resonant network. In accordance with the present invention, branch 15 includes a capacitance 18 serially connected between the high potential end of inductance coil 14 and plate 12 of tube $V_1$. In the preferred embodiment, capacitance 18 is a trimmer capacitor. Existent between plate 12 and chassis or ground 25 is the inherent distributed output capacitance of the plate circuit of tube $V_1$. This distributed output capacitance is indicated in the drawing by a dotted line representation and is identified by reference numeral 19.

It will be seen that distributed capacitance 19 is in effect serially connected with capacitance 18 in shunt across inductance 14. The total capacitance of branch 15 is therefore a combination of two capacitances in series, and is hence less than the magnitude of the distributed output capacitance 19 alone. For a given circuit, the magnitude of output capacitance 19 is fixed, as by the type and physical dimensions of the particular tube and associated output elements, including wiring. The total capacitance of branch 15 consequently hinges upon the value selected for capacitor 18; and the selected value is preferably of the same general order of magnitude as that of distributed output capacitance 19. For example, in an amplifier circuit embodying my invention which I built for operation over the FM frequency range of 88–108 mc., the inherent distributed output capacitance of tube $V_1$ and associated wiring measured 8 $\mu\mu$f., and I selected and used with very satisfactory results values for capacitor 18 ranging 4 to 30 $\mu\mu$f. Of course these values are not intended to be limiting and are given merely as illustrative of a range of capacitance values which gave improved and satisfactory results with a particular circuit.

It will be understood from the discussion previously given that the connection of capacitor 18 between plate electrode 12 and the high potential end of inductance 14 reduces the capacitance of branch 15, thus making possible the employment of more inductance for a given resonant frequency than would otherwise be permissible. And it will be further understood that the employment of increased inductance and decreased capacitance in a parallel resonant network greatly increases the L/C ratio and hence the parallel impedance of said network.

Attention is now directed to capacitive branch 16. This branch is on the grid side of inductance coil 14 and is comprised of capacitances 20 and 21. Capacitance 20 represents the inherent distributed input capacitance of tube $V_2$ and is shown in the drawing by a dotted line representation. Capacitance 21 is, in accordance with my invention, a capacitor connected between the high potential end of inductance coil 14 and control grid 13 of tube $V_2$. Thus, capacitor 21 is serially connected with distributed input capacitance 20 in shunt across inductance coil 14. The value of capacitor 21 is preferably of the same general order of magnitude as the distributed input capacitance 20. In an amplifier circuit which I built embodying the present invention, the static or geometric input capacitance 20 measured about 3 $\mu\mu$f. and I used values for capacitor 21 ranging from 5 to about 20 $\mu\mu$f. The most satisfactory results were obtained when capacitor 21 had a value of 10 $\mu\mu$f., but the entire range of indicated values gave improved results over prior art R.F. amplifier circuits.

It will be understood from the discussion previously given with respect to branch 15, that for a given circuit the total capacitance of branch 16 depends upon the value selected for capacitor 21, and that the total is always less than the capacitance of distributed input capacitance 20 alone. Consequently, for a given resonant frequency, the inductance of coil 14 may be larger than would be possible if capacitor 21 were not employed; and hence a larger voltage is developed across resonant network 10.

We see then that the capacitances of each of the branches 15 and 16 may be substantially reduced by the connection of capacitors 18 and 21 respectively, and that, for a given high frequency, the inductance of coil 14, and the L/C ratio of the resonant circuit, may be substantially larger.

It has been stated hereinbefore that capacitors 18 and 21 are preferably of the same general order of magnitude as are distributed capacitances 19 and 20. The actual values selected for capacitors 18 and 21 will of course depend upon the particular circuit and circuit parameters involved. In general, the selected values will represent a compromise between conflicting factors. For example, to achieve a maximum permissible increase in inductance 14 at a given resonant frequency, the values of capactors 18 and 21 should be very small. But since these capacitors also function as coupling elements, the attenuation of signal through these capacitors makes it disadvantageous to select capacitance values which are smaller than necessary. Optimum values may be readily determined for particular conditions and desired results.

The presence of capacitors 18 and 21 in the circuit inevitably introduces a small additional capacitance to ground; this effect has not proven troublesome, and is more than offset by the benefits provided. The effect can be minimized by selecting capacitors of small physical size.

The voltage applied to control grid 13 of tube $V_2$ is the voltage developed across input capacitance 20 and is less than the total voltage developed across inductance coil 14. The relationship between the voltage applied to grid 13 and the total voltage developed across the inductance coil will depend of course upon the relationship between the values of capacitances 20 and 21, as will be seen from the fact that these capacitances form a voltage divider circuit.

While the voltage applied to grid 13 necessarily represents a step-down from the total voltage across the resonant network, this step-down is appreciably more than offset by the increased voltage derived from the employment of greater inductance and by the substantially corresponding voltage step-up achieved on the plate side of the network.

An important feature of my improved circuit, which is attributable to the increased inductance made possible through the practice of the present invention, resides in the fact that a much greater frequency-range can now be covered than was possible heretofore. This results from the fact that, in practice, a much greater relative change in inductance can be obtained with high-inductance permeability-tuned inductors than is possible with similar tuning units having very low inductance.

In the claim, the term "very-high-frequency amplifier circuit" is used to define a circuit for amplifying frequencies of from 30 to 300 megacycles.

Having described my invention, I claim:

A very-high-frequency amplifier circuit having a first tube and a second tube; means for coupling an output electrode of said first tube to an input electrode of said second tube, said coupling means comprising a parallel-resonant network having a variable inductive branch shunted by a first capacitive branch and by a second capacitive branch, said first capacitive branch including the inherent distributed output capacitance of said first tube in series with a first capacitor of substantially the same order of magnitude as said output capacitance, said first capacitor being serially connected between said output electrode and a high potential end of said inductive branch, said second capacitive branch including the inherent distributed input capacitance of said second tube in series with a second capacitor of substantially the same order of magnitude as said input capacitance, said second capacitor being serially connected between said high potential end of said inductive branch and said input electrode.

MONTE I. BURGETT.

REFERENCES CITED

The following references are of record in the file of this patent:

UNITED STATES PATENTS

| Number | Name | Date |
|---|---|---|
| 1,708,950 | Norton | Apr. 16, 1929 |
| 1,861,707 | McIver | June 7, 1932 |
| 1,872,264 | Feldtkeller | Aug. 16, 1932 |
| 1,981,071 | Roberts | Nov. 20, 1934 |
| 2,113,603 | Polydoroff | Apr. 12, 1938 |
| 2,310,455 | Muller | Feb. 9, 1943 |